United States Patent [19]
Guegnaud et al.

[11] Patent Number: 5,751,188
[45] Date of Patent: May 12, 1998

[54] FM DEMODULATOR USING A SWITCHED CAPACITOR PHASE SHIFTER

[75] Inventors: Hervé Guegnaud, Maurepas; Michel Robbe, Conflans Sainte Honorine, both of France

[73] Assignee: Matra Communication, France

[21] Appl. No.: 763,002

[22] Filed: Dec. 10, 1996

[30] Foreign Application Priority Data

Dec. 12, 1995 [FR] France ................................ 95 14708

[51] Int. Cl.[6] .................................................... H03D 3/06
[52] U.S. Cl. ......................... 329/323; 329/336; 455/214; 455/337
[58] Field of Search ............................ 329/336, 323; 455/214, 337

[56] References Cited

U.S. PATENT DOCUMENTS

| | | | |
|---|---|---|---|
| 4,455,539 | 6/1984 | Wurzberg | 333/173 |
| 4,616,186 | 10/1986 | Jansen | 329/320 |
| 4,975,653 | 12/1990 | Kennedy et al. | 329/318 |

FOREIGN PATENT DOCUMENTS 0 162 525 11/1985 European Pat. Off. .
WO95/27340 10/1995 WIPO .

OTHER PUBLICATIONS

—Patent Abstracts of Japan—vol. 009, No. 089, Apr. 1985 –59–219005 Dec. 10, 1984.

*Primary Examiner*—Siegfried H. Grimm
*Attorney, Agent, or Firm*—Evenson, McKeown, Edwards & Lenahan, P.L.L.C.

[57] ABSTRACT

In order to process an input signal exhibiting a frequency modulation about an intermediate frequency, the demodulator includes a first mixer for producing a first signal exhibiting the frequency modulation about a transposition frequency lower than the intermediate frequency; a switched-capacitor phase-shifter receiving the first signal so as to produce a second signal exhibiting, with respect to the first signal, a phase-shift varying substantially linearly with frequency about the transposition frequency; two substantially identical low-pass filters receiving the second signal and the first signal respectively; and a second mixer for mixing the signals produced by the first and second low-pass filters, in order to deliver a baseband output signal.

7 Claims, 4 Drawing Sheets

FM DEMODULATOR USING A SWITCHED CAPACITOR PHASE SHIFTER

BACKGROUND OF THE INVENTION

The present invention relates to a demodulator for a frequency modulated radio signal. The invention applies more particularly to the demodulation of radio signals whose frequency has already been restored back around an intermediate frequency $f_I$.

We consider an input signal of frequency $f=f_I+\Delta f$, the frequency departure $\Delta f$ being representative of information conveyed by the signal. In order to demodulate such an input signal, use is generally made of a mixer which multiplies this signal $\cos(2\pi ft)$ by a phase-shifted version $\cos(2\pi ft+\phi(\Delta f))$ of this same signal, the phase-shift $\phi(\Delta f)$ varying linearly with the frequency departure $\Delta f$. The mixed signal is then proportional to $\cos(4\pi ft+\phi(\Delta f))+\cos(\phi(\Delta f))$. The first term is eliminated by a low-pass filter. The output signal from this low-pass filter is therefore proportional to $\cos\phi(\Delta f)$, so that it is a baseband signal representative of the frequency modulation $\Delta f$.

When it is desired to embody the demodulator in the form of an integrated circuit, it is still necessary to use an external pole in order to introduce the phase-shift $\phi(\Delta f)$. This external pole consists of a ceramic filter or of an element which can be tuned using a ferrite core. The main drawbacks of these known demodulators are the need for an external component, the frequent tunings which it requires, non-negligible distortion and the use of an external pin of the integrated circuit.

An object of the present invention is to provide a demodulator which can be wholly embodied in the form of an integrated circuit and which is less affected by the above drawbacks.

SUMMARY OF THE INVENTION

The invention thus provides a demodulator circuit for processing an input signal exhibiting a frequency modulation about an intermediate frequency and for producing a baseband output signal representative of said modulation, comprising:

first mixing means for mixing the input signal and a wave of predetermined frequency in order to produce a first signal exhibiting said frequency modulation about a transposition frequency equal to the difference between the intermediate frequency and said predetermined frequency;

switched-capacitor phase-shifter means to which the first signal is applied in order to produce a second signal exhibiting, with respect to the first signal, a phase-shift varying in a manner substantially linear with frequency about the transposition frequency;

a first low-pass filter to which the second signal is applied in order to eliminate high-frequency components from the second signal;

a second low-pass filter substantially identical to the first low-pass filter, to which the first signal is applied; and second mixing means for mixing signals produced by the first and second low-pass filters respectively, in order to deliver the baseband output signal.

The use of switched-capacitor filters to produce the phase-shift varying linearly with frequency departure offers numerous advantages. Thus, the phase-shifter filter can be integrated with the remainder of the circuit. Moreover, the parameters of the filter are closely controlled and hence it is possible to dispense with the external adjustments required in the prior demodulators. The switched-capacitor phase-shifter can be of higher order than the external phase-shifter filter used in prior demodulators (typically LC resonators of order 1), so that it is possible to construct a phase-shifter exhibiting excellent phase linearity by virtue of weak undulation in the group propagation time in the bandwidth. The switched-capacitor phase-shifter means preferably consist of two serially mounted switched-capacitor cells of order 2, namely a low-pass filtering cell and a band-pass filtering cell.

Since the application of the phase-shift results from a switched-capacitor device, the centre frequency of the signal forwarded to this device must be much lower than the sampling frequency of the device, which is typically a few MHz. This is why the first mixing means are provided for lowering the centre frequency of the signal.

The first low-pass filter serves to eliminate high-frequency residual components from the phase-shifted signal which are due to the sampling frequency in the switched-capacitor device or to its harmonics. Since this first low-pass filter also introduces some phase-shift, the second filter, having characteristics as similar as possible, is used to filter the first signal before it is mixed with the phase-shifted and filtered signal.

DESCRIPTION OF A PREFERRED EMBODIMENT

Figure 1:
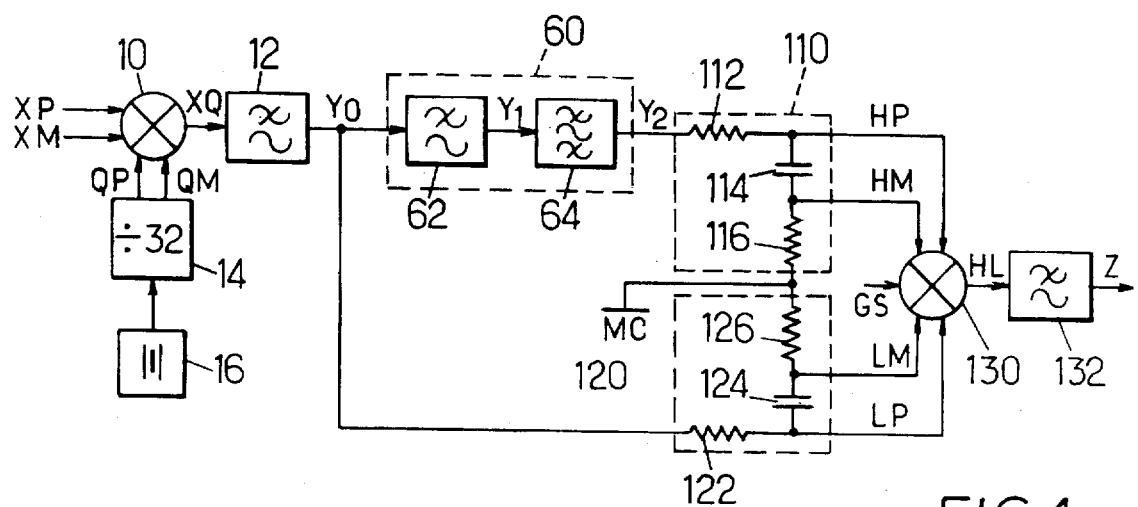
FIG. 1 is a diagram of a demodulator circuit according to the invention.

The demodulator of FIG. 1 comprises first mixing means consisting of a multiplier 10 associated with a low-pass filter 12. The input signal of the circuit is available in the form of two differential voltage signals XP,XM=–XP. In addition to the voltage signals XP, XM, the multiplier 10 receives two other differential voltage signals QP,QM=–QP representing a wave with frequency $f_0$. This wave is produced by a frequency divider 14 from a signal produced at a reference frequency by a quartz oscillator 16.

In the example considered here, the intermediate frequency $f_I$ is 450 kHz, and the frequency of the wave QP, QM is 348.44 kHz. This frequency $f_0$ is obtained by dividing by 32 the frequency of the quartz 16 which is 11.15 MHz.

The low-pass filter 12 eliminates the components with frequency near $f_I+f_0$ from the output signal XQ from the multiplier 10, so as to leave in the signal Y0 only the components near the transposition frequency $f_T=f_I-f_0=$ 102.56 kHz.

Figure 2:
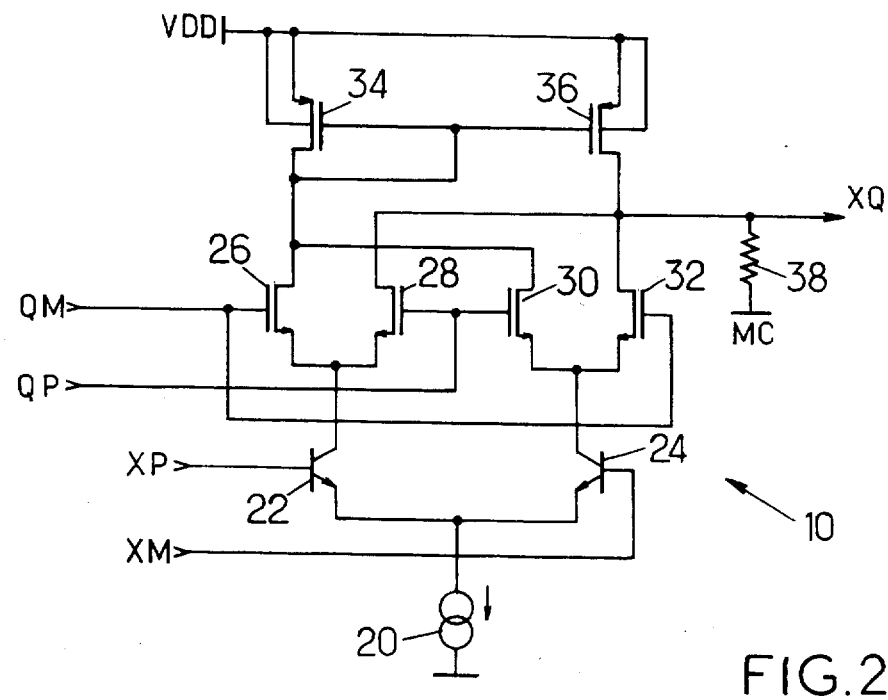
FIG. 2 is a diagram of a multiplier of the circuit of FIG. 1.

The multiplier 10 has for example the structure of a Gilbert cell, as represented in FIG. 2. A current generator 20 delivering a constant current is connected between ground and the emitters of two npn transistors 22, 24. The base of the transistor 22 receives the voltage signal XP, while the base of the transistor 24 receives the voltage signal XM=– XP. The second stage of the Gilbert cell consists of four NMOS transistors 26, 28, 30, 32. The sources of the NMOS transistors 26, 28 are linked to the collector of the npn transistor 22, whilst the sources of the NMOS transistors 30, 32 are linked to the collector of the npn transistor 24. The gates of the NMOS transistors 28, 30 receive the voltage signal QP, whilst the gates of the NMOS transistors 26, 32 receive the voltage signal QM. The multiplier furthermore comprises a PMOS mirror composed of two PMOS transistors 34, 36 having their sources linked to a positive supply voltage VDD. The drain of the transistor 34 is linked to the drains of the NMOS transistors 26, 30, whilst the drain of the PMOS transistor 36 is linked to the drains of the NMOS transistors 28, 32. The gates of the PMOS transistors 34, 36 are also linked to the drains of the NMOS transistors 26, 28. The output voltage XQ from the mixer is available on the drains of the NMOS transistors 28, 32 which are linked, by way of a resistor 38, to a terminal standing at a reference potential MC (for example ground).

Figure 3:
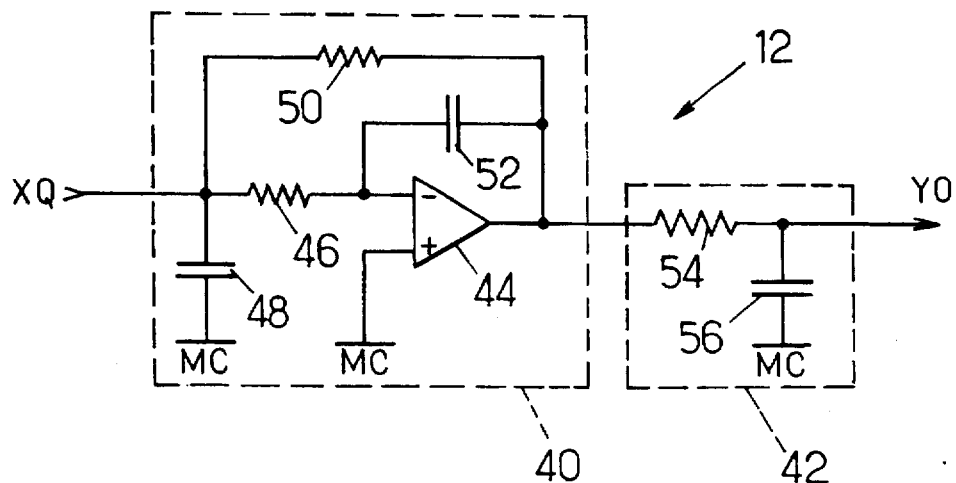
FIG. 3 is a diagram of a low-pass filter of the circuit of FIG. 1.

The low-pass filter 12 is preferably of order at least equal to 3. This filter 12 reduces the spectrum of the signal so as to limit the cross-modulation products so as not to disturb the switched-capacitor device. FIG. 3 shows a filter 12 of order 3 composed of a simplified Rausch cell 40 and a low-pass RC network 42. The cell 40 comprises an operational amplifier 44 whose positive input is linked to the potential MC and whose negative input is linked, by way of a resistor 46 to the input of the filter receiving the voltage signal XQ. The input of the filter is also linked to the potential MC by way of a capacitor 48, and to the output of the operational amplifier 44 by way of a resistor 50. An integration capacitor 52 links the negative input and the output of the operational amplifier 44. The RC network 42 comprises a resistor 54 linking the output of the operational amplifier 44 to the output of the filter 12 where the voltage signal Y0 is available, and a capacitor 56 connected between the potential MC and the output of the filter.

As a general rule, the intermediate frequency $f_I$ is between 440 and 500 kHz. A transposition frequency $f_T$ of between 200 and 300 kHz is then chosen. This choice of the transposition frequency $f_T$ which will be the centre frequency of the phase-shifter filters results from a compromise:

the centre frequency of the phase-shifter filters should remain large compared with the frequency excursion $\Delta f_{max}$ (such that $\Delta f_{max} < \Delta f < +\Delta f_{max}$) in order to retain a linear phase in the bandwidth;

on the other hand, the departure between $f_I-f_0$ and $f_I+f_0$ should be sufficiently large to obtain good filtering of the parasitic spectral line present around $f_I+f_0$.

Furthermore, since the phase-shifting filtering uses switched capacitors, the centre frequency should be considerably less than the sampling frequency which is a few MHz. Under these conditions, the components of the low-pass filter 12 are advantageously sized so that this filter has a cutoff frequency of between 200 and 300 kHz.

It was seen that, in the example considered, the transposition frequency $f_T$ is 102.56 kHz for an intermediate frequency $f_I$ of 450 kHz. The cutoff frequency of the filter 12 is then for example of the order of 240 kHz, it being possible to obtain this with an active cell 40 having a cutoff frequency of 263 kHz and a Q factor of 0.687 and an RC network 42 having a cutoff frequency of 284 kHz. These values are for example obtained with the following sizing: $R_{46}=68$ k$\Omega$, $C_{48}=16$ pF, $R_{50}=42$ k$\Omega$, $C_{52}=8$ pF, $R_{54}=35$ k$\Omega$, $C_{56}=16$ pF, $R_i$ denoting the ohmic value of the resistor bearing the reference i, and $C_j$ denoting the capacitance of the capacitor bearing the reference j.

The demodulator represented in FIG. 1 comprises switched-capacitor phase-shifting means 60 to which the output signal Y0 from the low-pass filter 12 is applied. These phase-shifting means 60 comprise two switched-capacitor filtering cells mounted in series, namely a low-pass cell 62 of order 2 and a band-pass cell 64 of order 2. These two filtering cells are controlled by two clock signals H1, H2 at the sampling frequency. The sampling frequency is obtained by frequency division based on the quartz oscillator 16. The sampling frequency is for example 2.7875 MHz=11.15 MHz/4. The clock signals H1, H2 are non-overlapping, that is to say they are never active at the same time.

Figure 4:
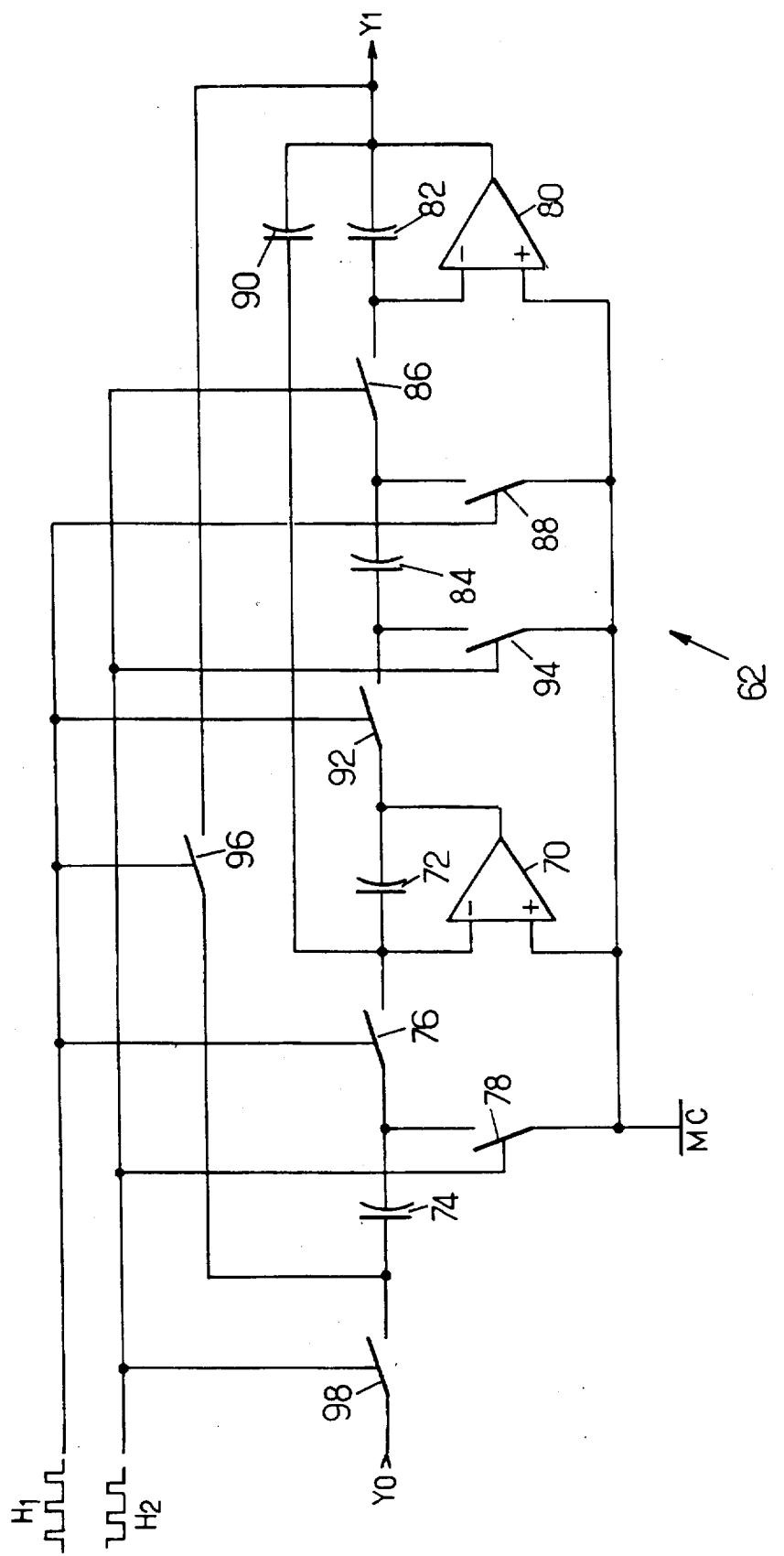
FIGS. 4 and 5 are diagrams of a low-pass filter and of a band-pass filter having switched capacitors of the circuit of FIG. 1.

The low-pass cell 62 has for example the structure represented in FIG. 4. This structure comprises two operational amplifiers 70, 80 having their positive inputs connected to the potential MC. Each amplifier 70, 80 is associated with a respective integrative capacitor 72, 82 and with a respective charge capacitor 74, 84. Each integration capacitor 72, 82 links the output of its associated amplifier with its negative input. A respective switch 76, 86 is mounted between the negative input of each operational amplifier 70, 80 and a terminal of its associated charge capacitor 74, 84. These same terminals of the charge capacitors 74, 84 are furthermore linked to the potential MC by way of respective switches 78, 88. Another capacitor 90 links the negative input of the operational amplifier 70 to the output of the operational amplifier 80. A switch 92 is mounted between the output of the amplifier 70 and the other terminal of the capacitor 84. A switch 94 is mounted between this other terminal of the capacitor 84 and the reference terminal at the potential MC. A switch 96 is mounted between the other terminal of the charge capacitor 74 and the output of the operational amplifier 80 constituting the output of the cell, at which the voltage signal Y1 is delivered. Finally, a switch 98 links this other terminal of the charge capacitor 74 to the input of the cell receiving the voltage signal Y0. The switches 76, 88, 92, 96 are controlled by the clock signal H1 so as to be closed only when the signal Hi is active (for example H1=1). The switches 78, 86, 94, 98 are controlled by the other clock signal H2 so as to be closed only when the signal H2 is active (H2=1).

Such a switched-capacitor low-pass cell has a transfer function of the form $$H_{LP} = \frac{-C_{W1}^2}{1 + (-2 + C_{W1}C_{Q1} + C_{W1}^2)z + (1 - C_{W1}C_{Q1})z^2}$$

where $C_{W1}$ represents the capacitance of the charge capacitors 74, 84, and $C_{Q1}$ represents the capacitance of the capacitor 90. These capacitances $C_{W1}, C_{Q1}$ are understood to be normalized with respect to the capacitance of the integration capacitors 72, 82.

Figure 5:
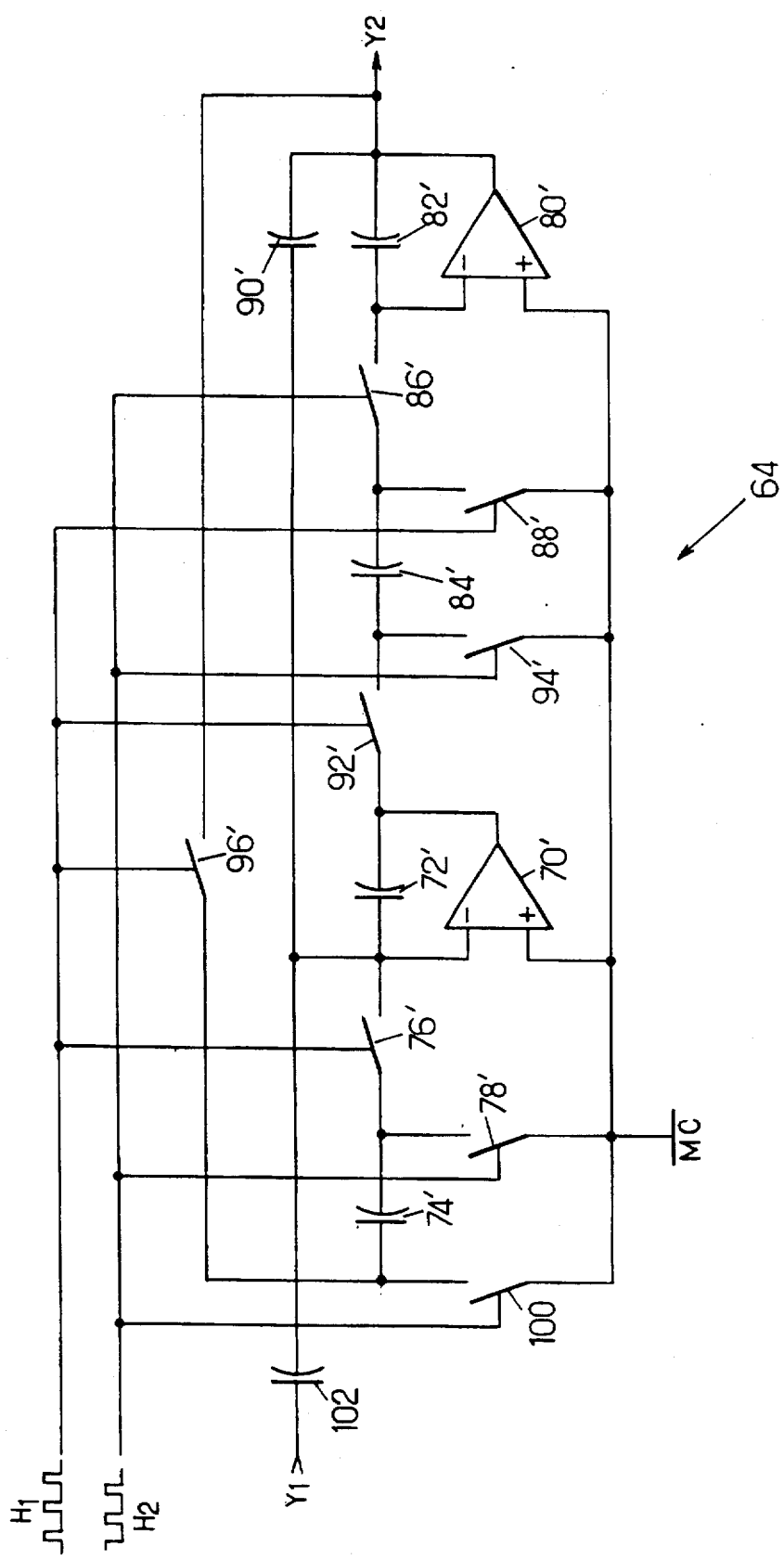

The band-pass cell 64 has for example the structure illustrated in FIG. 5. This structure is in large part similar to that described earlier with reference to FIG. 4. The same numerical references have therefore been used as in FIG. 4, with a prime symbol, to denote elements of like nature arranged in the same manner. The band-pass cell of FIG. 5 differs from the low-pass cell of FIG. 4 in that the charge capacitor 74' is linked to the potential MC by way of a switch 100 instead of receiving the input signal Y1 from the cell, and in that the input signal Y1 is forwarded to the negative input of the operational amplifier 70' by way of a capacitor 102. The switch 100, which replaces the switch 98, is controlled by the clock signal H2 so as to be closed only when the signal H2 is active (H2=1). This bandpass cell 64 has a transfer function of the form $$H_{BP} = \frac{-C_{W2}C_{G2} + C_{W2}C_{G2}z}{1 + (-2 + C_{W2}C_{Q2} + C_{W2}^2)z + (1 - C_{W2}C_{Q2})z^2}$$

where $C_{W2}$ denotes the capacitance of the charge capacitors 74', 84', $C_{G2}$ denotes the capacitance of the input capacitor 102, and $C_{Q2}$ denotes the capacitance of the capacitor 90'. These capacitances $C_{W2}$, $C_{G2}$ and $C_{Q2}$ are understood to be normalized with respect to the capacitance of the integration capacitors 72', 82'.

The behaviour of the switched-capacitor cells 62, 64 can be optimized by searching for the coefficients of the transfer functions which minimize the phase distortion. In the particular example considered earlier, it is thus possible to adopt a low-pass cell 62 of order 2 having a cutoff frequency of 93.5 kHz and a Q factor of 4, and a band-pass cell 64 of order 2 having a cutoff frequency of 108.9 kHz and a Q factor of 4.7. With a sampling frequency of 2.7875 MHz and cells having the structures represented in FIGS. 4 and 5 with integration capacitances of 5 pF, these transfer functions can be obtained with the following numerical values: $C_{G2}$=1 pF, $C_{W2}$=1.218 pF, $C_{Q2}$=1.042 pF, $C_{W1}$=1.048 pF, and $C_{Q1}$=1.227 pF.

The spectrum of the output signal Y2 from the switched-capacitor device 60 exhibits lines at high frequency which are due to the sampling frequency and its harmonics. A low-pass filter 110 is provided so as to eliminate these high-frequency lines (FIG. 1). This filter 110 consists of an RC network of order 1 comprising, between the input receiving the signal Y2 and the reference terminal at the potential MC, a resistor 112, a capacitor 114 and a resistor 116 mounted in series. The output signal from the filter 110 consists of the voltage HP-HM across the terminals of the capacitor 114.

As the low-pass filter 110 introduces some phase-shift, there is provided another low-pass filter 120 of identical makeup processing the signal Y0. This filter 120 comprises a resistor 122, a capacitor 124 and a resistor 126 having characteristics as similar as possible to those of the components 112, 114, 116 of the filter 110, and arranged in the same manner. The voltage LP-LM across the terminals of the capacitor 124 constitutes the output signal from the filter 120.

The signal Y0 is of the form $\cos(2\pi ft)$, with the frequency f of the form $f_I+\Delta f$, $\Delta f$ representing the frequency modulation of the input radio signal about the intermediate frequency $f_I$. Under these conditions, the output voltage HP-HM from the low-pass filter 110 is proportional to $\cos(2\pi ft+\phi(\Delta f)+\psi(f))$, where $\phi(\Delta f)$ denotes the phase shift produced by the switched-capacitor phase-shifter device 60, which varies linearly with frequency about the transposition frequency, and $\psi(f)$ denotes the phase-shift introduced by the low-pass filter 110 at the frequency f. The output voltage LP-LM from the low-pass filter 120 is proportional to $\cos(2\pi ft+\psi(f))$. By multiplying the voltages HP-HM and LP-LM, we then obtain a signal proportional to $\cos(4\pi ft+\phi(\Delta f)+2\psi(f))+\cos(\phi(\Delta f))$. Low-pass filtering makes, it possible to eliminate the first term and retain only the second information-carrying term, proportional to $\cos(\phi(\Delta f))$, in the baseband output signal Z.

The demodulator represented in FIG. 1 thus comprises mixing means consisting of a multiplier 130 and a low-pass filter 132 producing the baseband output signal Z from the output signal HL from the multiplier 130. The low-pass filter 132 can consist simply of an RC network.

Figure 6:
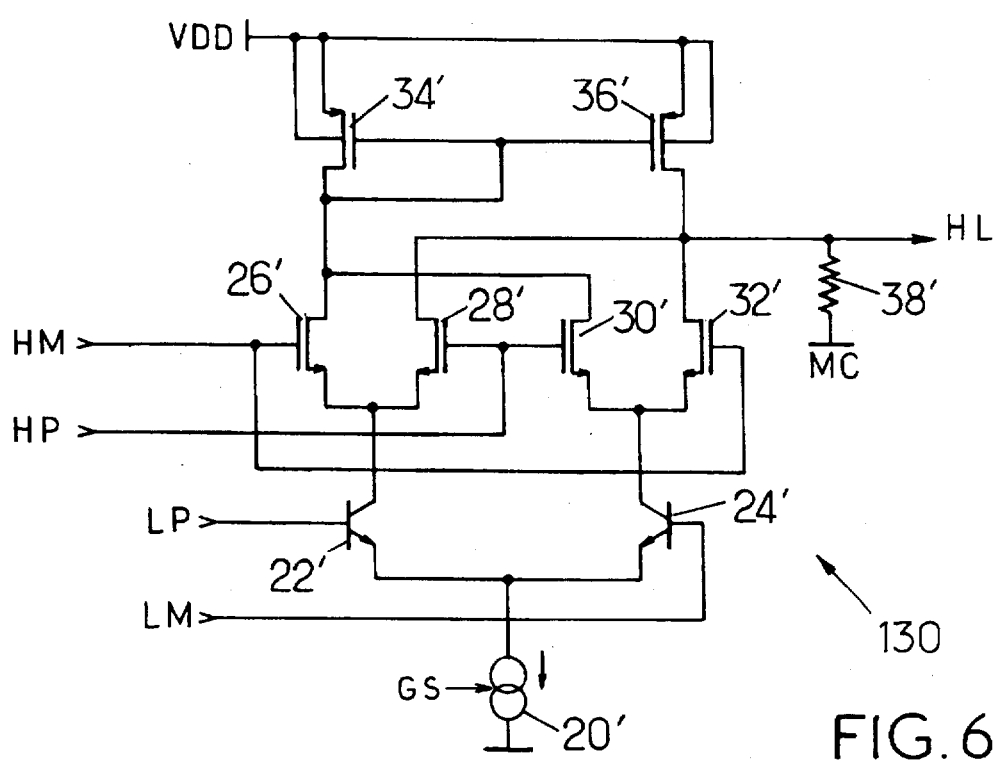
FIG. 6 is a diagram of another multiplier of the circuit of FIG. 1.

The multiplier 130 has for example the structure represented in FIG. 6. This is a Gilbert cell structure very similar to that represented in FIG. 2. Consequently, the same numerical references as in FIG. 2 have been used with the sign "'", to denote analogous components. The bases of the npn transistors 22', 24' of the first stage of the Gilbert cell respectively receive the voltage LP present between the resistor 122 and the capacitor 124 of the low-pass filter 120, and the voltage LM present between the capacitor 124 and the resistor 126 of the low-pass filter 120. The gates of the NMOS transistors 28', 30' of the second stage of the Gilbert cell receive the voltage HP present between the resistor 112 and the capacitor 114 of the low-pass filter 110. The gates of the NMOS transistors 26', 32' of the second stage of the Gilbert cell receive the voltage HM present between the capacitor 114 and the resistor 116 of the low-pass filter 110. The output voltage HL from the multiplier is available on the drains of the NMOS transistors 28' and 32'.

In order to adjust the amplitude of the output signal HL or Z, there is advantageously provision for the current generator 20' of the multiplier 130 to deliver a current dependent on a gain control signal GS. Such adjustment makes it possible in particular to take into account various possible bandwidths in respect of communication channels (for example 12.5 kHz and 25 kHz in the case of the CT0 standards).

We claim:

1. Demodulator circuit for processing an input signal exhibiting a frequency modulation about an intermediate frequency and for producing a baseband output signal representative of said modulation, comprising :

first mixing means for mixing the input signal and at least one wave of predetermined frequency in order to produce a first signal exhibiting said frequency modulation about a transposition frequency equal to a difference between the intermediate frequency and said predetermined frequency;

switched-capacitor phase-shifter means to which the first signal is applied in order to produce a second signal exhibiting, with respect to the first signal, a phase-shift varying in a manner substantially linear with frequency about the transposition frequency;

a first low-pass filter to which the second signal is applied in order to eliminate high-frequency components from the second signal;

a second low-pass filter substantially identical to the first low-pass filter, to which the first signal is applied; and second mixing means for mixing signals produced by the first and second low-pass filters respectively, in order to deliver the baseband output signal.

2. Demodulator circuit according to claim 1, wherein the first mixing means comprise a multiplier forming the product between the input signal and said wave of predetermined frequency, and a low-pass filter of order at least equal to 3 for producing the first signal from an output from the multiplier.

3. Demodulator circuit according to claim 2, wherein, with the intermediate frequency lying between 440 and 500 kHz, the transposition frequency lies between 80 and 200 kHz, and said low-pass filter of order at least equal to 3 has a cutoff frequency of between 200 and 300 kHz.

4. Circuit according to claim 1, wherein the switched-capacitor phase-shifter means comprise a low-pass switched-capacitor filtering cell of order 2 and a band-pass switched-capacitor filtering cell of order 2 mounted in series.

5. Circuit according to claim 1, wherein the first and second low-pass filters are RC networks of order 1.

6. Circuit according to claim 1, wherein the second mixing means comprise a multiplier forming the product between the signals produced by the first and second low-pass filters, and a low-pass filter for producing the baseband output signal from a product signal delivered by the multiplier.

7. Circuit according to claim 6, wherein said multiplier includes means for adjusting the amplitude of the product signal on the basis of a gain control signal.

* * * * *